United States Patent
Sato et al.

(10) Patent No.: US 6,792,670 B2
(45) Date of Patent: Sep. 21, 2004

(54) METHOD OF MANUFACTURING A MAGNETORESISTIVE ELEMENT SUBSTRUCTURE

(75) Inventors: Kazuki Sato, Tokyo (JP); Noriaki Kasahara, Tokyo (JP); Koji Shimazawa, Tokyo (JP)

(73) Assignee: TDK Corporation, Tokyo (JP)

( * ) Notice: Subject to any disclaimer, the term of this patent is extended or adjusted under 35 U.S.C. 154(b) by 77 days.

(21) Appl. No.: 09/809,278

(22) Filed: Mar. 16, 2001

(65) Prior Publication Data

US 2001/0028068 A1 Oct. 11, 2001

(30) Foreign Application Priority Data

Mar. 21, 2000 (JP) ........................................ 2000-077954

(51) Int. Cl.[7] .............................. G11B 5/39; B44C 1/22
(52) U.S. Cl. ................................ 29/603.15; 29/603.16; 29/603.18; 360/321; 360/316; 216/22; 216/48
(58) Field of Search .................. 29/603.07, 603.15, 29/603.16, 603.18; 360/321, 324.2, 316; 216/22, 48, 94; 451/8; 427/127, 131

(56) References Cited

U.S. PATENT DOCUMENTS

| | | | | |
|---|---|---|---|---|
| 3,787,964 A | * | 1/1974 | Simon et al. ........ | 29/603.15 X |
| 5,271,802 A | * | 12/1993 | Chang et al. .............. | 216/22 X |
| 5,799,388 A | * | 9/1998 | Shouji ....................... | 216/22 X |
| 6,344,954 B1 | | 2/2002 | Redon et al. ............. | 360/324.2 |
| 6,469,879 B1 | | 10/2002 | Redon et al. ............. | 360/324.2 |

FOREIGN PATENT DOCUMENTS

| JP | 59-217220 | * 12/1984 |
|---|---|---|
| JP | 60-191418 | * 9/1985 |

* cited by examiner

Primary Examiner—A. Dexter Tugbang
(74) Attorney, Agent, or Firm—Oliff & Berridge, PLC

(57) ABSTRACT

A method is provided for manufacturing a magnetoresistive device substructure. The substructure includes: a TMR element; a bias field inducing layer that covers the TMR element; and a front flux probe layer formed on the bias field inducing layer and introducing a signal flux to the TMR element. In the manufacturing method, the TMR element and a dummy element are first formed. The dummy element has a shape similar to the TMR element and located in a specific position with respect to the TMR element. Next, the bias field inducing layer is formed on the TMR element in a specific position referring to the position of the dummy element. At the same time, a dummy bias field inducing layer is formed in a position located off the dummy element. Next, the front flux probe layer and a dummy front flux probe layer are formed at the same time on the bias field inducing layer and the dummy element, respectively.

15 Claims, 18 Drawing Sheets

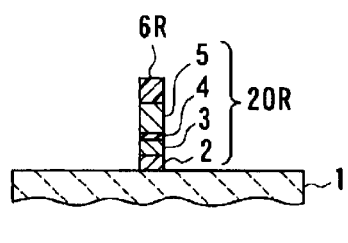
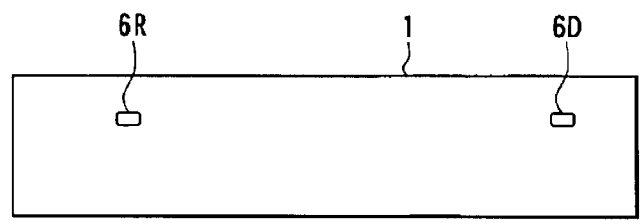
FIG. 3A                FIG. 3B
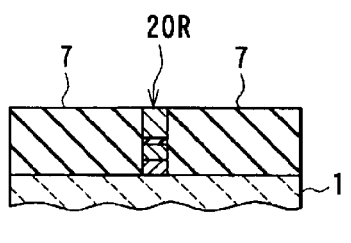
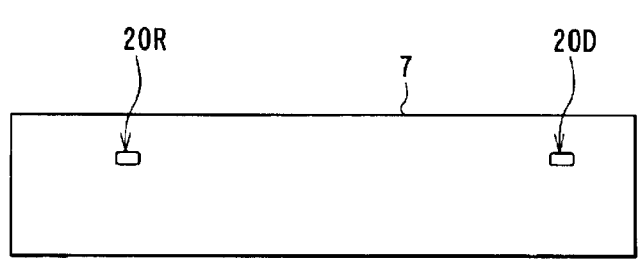
FIG. 4A                FIG. 4B

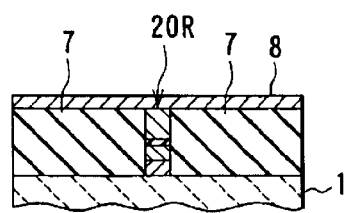
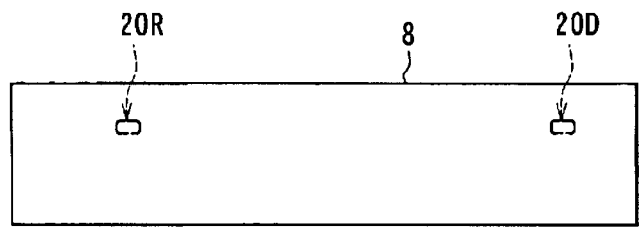
FIG. 5A          FIG. 5B
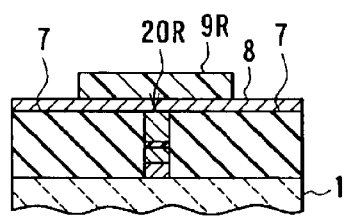
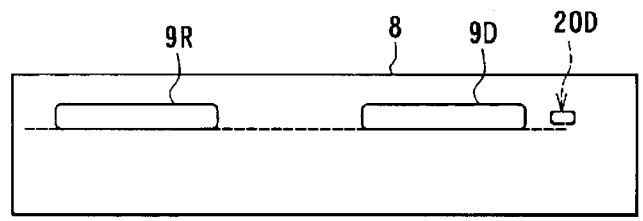
FIG. 6A          FIG. 6B

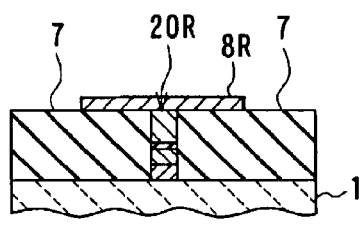 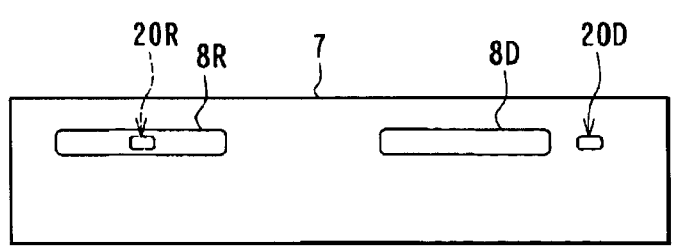
FIG. 7A                FIG. 7B
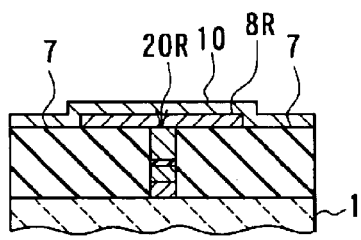 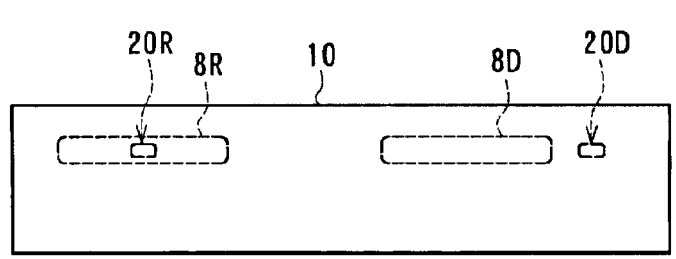
FIG. 8A                FIG. 8B

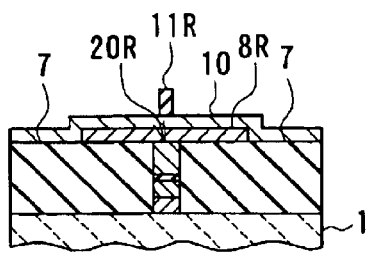
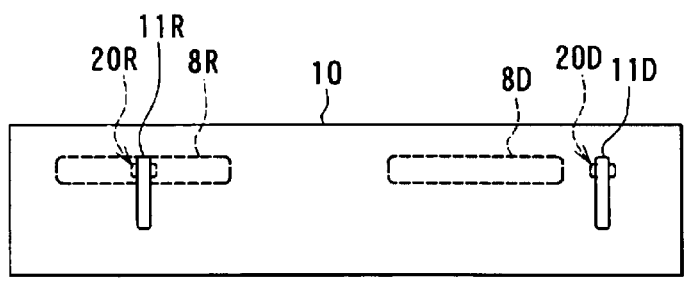
FIG. 9A					FIG. 9B
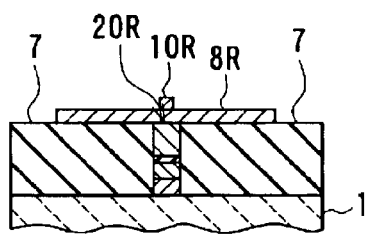
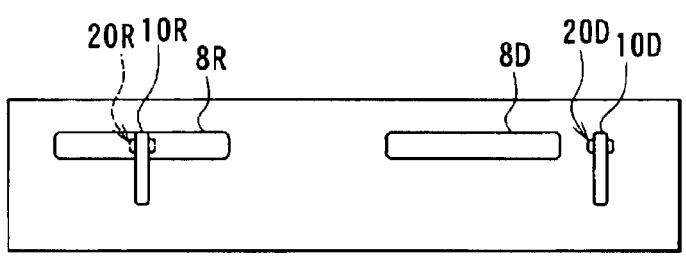
FIG. 10A					FIG. 10B

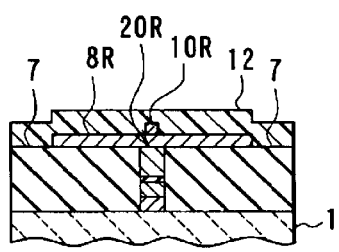
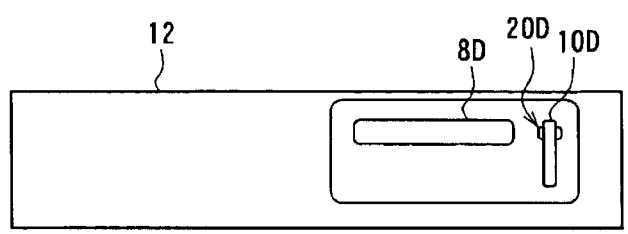
FIG. 11A   FIG. 11B
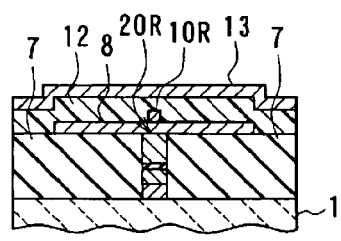
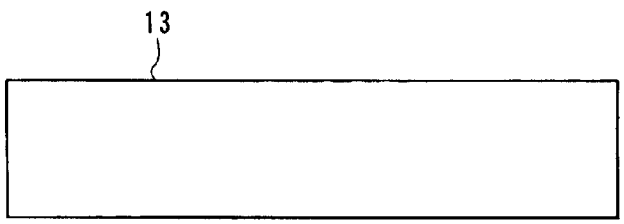
FIG. 12A   FIG. 12B

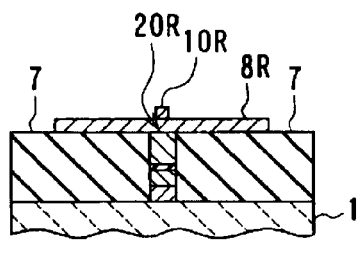 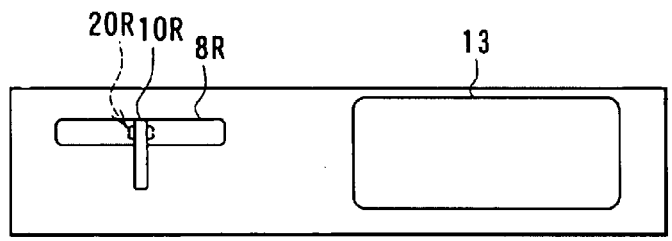
FIG. 13A  FIG. 13B
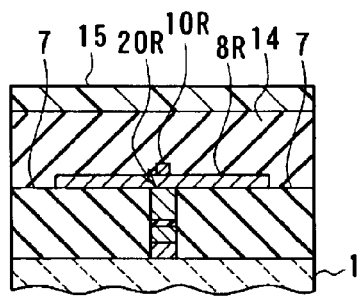 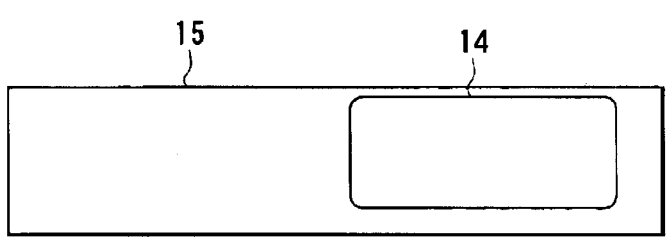
FIG. 14A  FIG. 14B

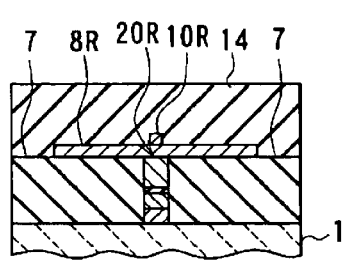 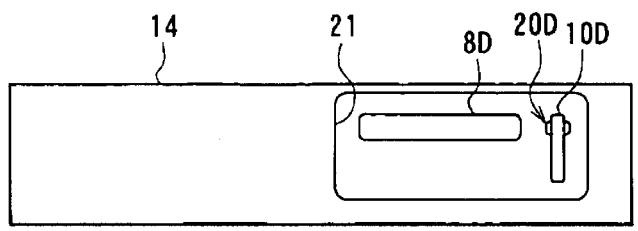
FIG. 15A          FIG. 15B
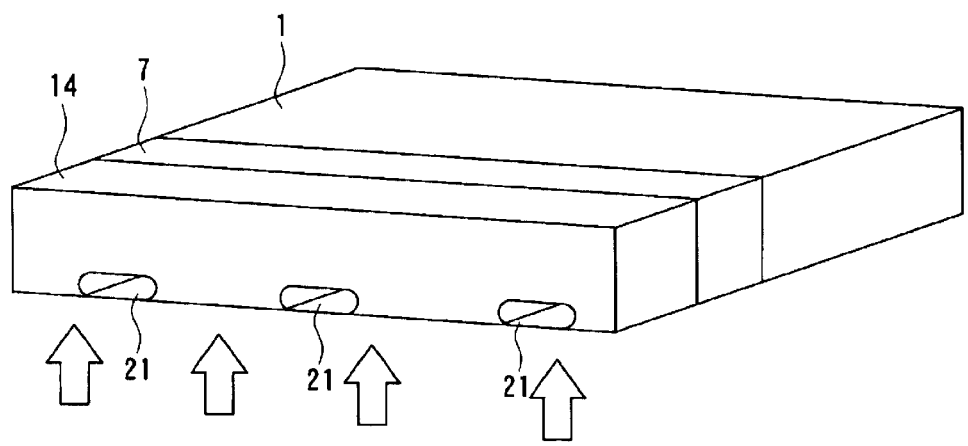
FIG. 16

METHOD OF MANUFACTURING A MAGNETORESISTIVE ELEMENT SUBSTRUCTURE

BACKGROUND OF THE INVENTION

1. Field of the Invention

The present invention relates to a magnetoresistive device substructure including magnetoresistive elements, a magnetoresistive device including a magnetoresistive element, and a micro device including a first patterned thin film and a second patterned thin film that covers the first thin film, and to methods of manufacturing such a magnetoresistive device substructure, a magnetoresistive device and a micro device.

2. Description of the Related Art

Performance improvements in thin-film magnetic heads have been sought as recording density of hard disk drives has increased. Such thin-film magnetic heads include composite thin-film magnetic heads that have been widely used. A composite head is made of a layered structure including a recording head having an induction-type electromagnetic transducer for writing and a reproducing head having a magnetoresistive element for reading.

Reproducing heads that exhibit high sensitivity and produce high outputs have been required. In response to such demands, attention has been focused on tunnel magnetoresistive elements (that may be hereinafter called TMR elements) that detect a magnetic field through the use of the tunnel magnetoresistive effect.

As shown in FIG. 21, the TMR element has a structure in which a lower magnetic layer 102, a tunnel barrier layer 103 and an upper magnetic layer 104 are stacked on a substrate 101. Each of the lower magnetic layer 102 and the upper magnetic layer 104 includes a ferromagnetic substance. In general, the magnetic layer closer to the substrate is called the lower magnetic layer and the magnetic layer farther from the substrate is called the upper magnetic layer. Therefore, the terms 'upper' and 'lower' of the upper and lower magnetic layers do not always correspond to the position in the arrangement of an actual TMR element.

The tunnel barrier layer is a layer made of a thin non-magnetic insulating film through which electrons are capable of passing while maintaining spins thereof by means of the tunnel effect, that is, through which a tunnel current is allowed to pass. The tunnel magnetoresistive effect is a phenomenon that, when a current is fed to a pair of magnetic layers sandwiching the tunnel barrier layer, a tunnel current passing through the tunnel barrier layer changes, depending on the relative angle between magnetizations of the two magnetic layers. If the relative angle between magnetizations of the magnetic layers is small, the tunneling rate is high. As a result, the resistance to the current passing across the magnetic layers is reduced. If the relative angle between magnetizations of the magnetic layers is large, the tunneling rate is low. The resistance to the current passing across the magnetic layers is therefore increased.

With regard to the structure of a thin-film magnetic head incorporating a TMR element, if the tunnel barrier layer made up of a thin insulating layer is exposed from the medium facing surface that faces toward a recording medium, a short circuit may occur during or after lapping of the medium facing surface. Such a structure is therefore not preferred.

To cope with such a problem, a thin-film magnetic head is disclosed in U.S. patent application Ser. No. 09/517,580. This head has a structure in which a TMR element retreats from the medium facing surface. FIG. 22 and FIG. 23 illustrate a front-flux-probe-type head as an example of the head having such a structure. FIG. 22 is a cross section of the main part of the head. FIG. 23 is a top view thereof This head comprises a pinning layer 105, a pinned layer 106, a tunnel barrier layer 107 and a free layer 108 that are stacked one by one. These layers make up the TMR element. The TMR element is located at a distance from the medium facing surface.

The head further comprises a front flux probe (FFP) layer 109 formed on the free layer 108. The FFP layer 109 is T-shaped and includes two portions one of which extends from the medium facing surface to a portion above the free layer 108, and the other of which is located in the portion above the free layer 108 and extends from side to side along the direction parallel to the medium facing surface. The FFP layer 109 is a soft magnetic layer that directly touches the TMR element. As shown in FIG. 22 and FIG. 23, the FFP layer 109 may be formed by adding a soft magnetic layer different from the TMR element in size. Alternatively, the FFP layer 109 may be made of a part of the free layer 108 of the TMR films.

The portion 109a of the FFP layer 109 that extends to the medium facing surface has the function of introducing a signal magnetic flux from the medium facing surface to the TMR element. The length of the portion 109a is called the front flux probe length (FFP length of FIG. 23).

The head further comprises a pair of hard magnet layers 110 located on the portion of the FFP layer 109 extending from side to side.

Another function of the FFP layer 109 is to effectively give the free layer of the TMR element a bias magnetic field in the horizontal direction obtained from the bias field applying layers such as the hard magnet layers and antiferromagnetic substances. In the case of the TMR element, as in the cases of an anisotropic magnetoresistive (AMR) element and a giant magnetoresistive (GMR) element, a short circuit occurs if the bias field applying layer touches an end of the element. As a result, no rate of change in resistance is detected. If the bias field applying layer directly touches a top portion or a bottom portion of the TMR element, no short circuit occurs. However, the problem is that, if the direction of magnetization of the pinned layer and the direction of magnetization of the free layer are antiparallel with respect to each other, a greater current flows through a portion of the tunnel barrier layer in which the bias field applying layer is located. As a result, the rate of change in resistance is reduced.

To solve the above-described problem, a technique is disclosed in U.S. patent application Ser. No. 09/517,455. According to this technique, a soft magnetic layer greater than a TMR element in width along the track width is formed. The soft magnetic layer has a portion located outside the TMR element. A bias field applying layer is located in this portion. This soft magnetic layer has the function of effectively inducing a bias field from the bias field applying layer to the free layer of the TMR element. The FFP layer 109 of FIG. 22 and FIG. 23 corresponds to this soft magnetic layer.

As described above, the FFP layer 109 having the functions of introducing a signal flux and inducing a bias field is T-shaped.

If the conventional photolithography technique is employed, the problem is that corners of a pattern reduced in size are rounded. The above-described front-flux-probetype head has a reproducing track width which is defined by the width of the front flux probe layer measured in the medium facing surface. Therefore, it should be avoided that corners of the front flux probe layer formed through the photolithography technique are rounded, since such rounded corners cause variations in track width. To avoid this problem, an electron beam exposure technique may be employed. In this case, however, the throughput is reduced while manufacturing costs increase since the apparatus required for electron beam exposure is expensive.

To reduce roundness of corners of the pattern, it is possible to provide the front flux probe layer having the shape of a rectangle greater than the TMR element, in place of the T-shaped front flux probe layer. However, this solution is not preferred since it is impossible that the track width is made smaller than the width of the TMR element.

To precisely control the dimensions and shape of the T-shaped soft magnetic layer having the functions of introducing a signal flux and inducing a bias field, it is possible to make the T-shaped soft magnetic layer in two steps by dividing it into two rectangular layers. Reference is now made to FIG. 24A to FIG. 33A and FIG. 24B to FIG. 33B to describe a method of manufacturing a magnetoresistive device including a soft magnetic layer formed through this method.

FIG. 24A to FIG. 33A and FIG. 24B to FIG. 33B illustrate steps of the method of manufacturing the magnetoresistive device including the soft magnetic layer and a TMR element. FIG. 24A to FIG. 33A are cross sections thereof FIG. 24B to FIG. 33B illustrate integrated surfaces.

In this method, as shown in FIG. 24A and FIG. 24B, a pinning layer 112, a pinned layer 113, a tunnel barrier layer 114 and a free layer 115 are stacked on a substrate 111 one by one.

Next, as shown in FIG. 25A and FIG. 25B, a resist mask 116 used for patterning the TMR element is formed by photolithography on the free layer 115.

Next, as shown in FIG. 26A and FIG. 26B, the pinning layer 112, the pinned layer 113, the tunnel barrier layer 114 and the free layer 115 are selectively etched through ion milling, for example, using the resist mask 116. The TMR element 120 made up of the pinning layer 112, the pinned layer 113, the tunnel barrier layer 114 and the free layer 115 that are patterned is thus formed.

Next, as shown in FIG. 27A and FIG. 27B, an insulating layer 117 is formed around the TMR element 120. The resist mask 116 is then removed.

Next, as shown in FIG. 28A and FIG. 28B, a bias field inducing layer 118 made of a soft magnetic material is formed on the TMR element 120 and the insulating layer 117.

Next, as shown in FIG. 29A and FIG. 29B, a resist mask 119 used for patterning the bias field inducing layer 118 is formed by photolithography on the layer 118. The plane geometry of the resist mask 119 is a rectangle extending from the portion above the TMR element 120 to both sides in the direction parallel to the medium facing surface.

Next, as shown in FIG. 30A and FIG. 30B, the field inducing layer 118 is selectively etched through ion milling, for example, using the resist mask 119. The field inducing layer 118 is thereby patterned into a rectangular shape. The resist mask 119 is then removed.

Next, as shown in FIG. 31A and FIG. 31B, a front flux probe (FFP) layer 121 made of a soft magnetic material is formed on the insulating layer 117 and the field inducing layer 118.

Next, as shown in FIG. 32A and FIG. 32B, a resist mask 122 used for patterning the FFP layer 121 is formed by photolithography on the layer 121. The plane geometry of the resist mask 122 is a rectangle extending from the portion above the TMR element 120 toward the medium facing surface.

Next, as shown in FIG. 33A and FIG. 33B, the FFP layer 121 is selectively etched through ion milling, for example, using the resist mask 122. The FFP layer 121 is thereby patterned into a rectangular shape. The resist mask 122 is then removed.

The T-shaped soft magnetic layer having the functions of introducing a signal flux and inducing a bias field is thus made up of the field inducing layer 118 and the FFP layer 121.

According to the above-described method, however, the resist mask 119 used for patterning the field inducing layer 118 is greater in area than the TMR element 120. As a result, when the resist mask 119 is formed, the TMR element 120 is hidden behind the resist mask 119, and alignment of the resist mask 119 and the TMR element 120 is made impossible. The positions of the TMR element 120 and the field inducing layer 118 with respect to each other are thereby shifted, which will cause variations in output.

In general, a flying-type thin-film magnetic head used for a magnetic disk drive is made up of a slider having a thin-film magnetic head element formed on its trailing edge. The slider has rails formed on the medium facing surface that faces toward a recording medium, and flies at a very low altitude from the surface of the recording medium by means of the air flow generated by rotations of the medium. The slider is formed through the following steps. A substructure utilized is made up of a plurality of rows of sections to be sliders (hereinafter called slider sections) formed on a wafer. Each of the slider sections includes a thin-film magnetic head element. This substructure is cut in one direction to form blocks called bars each of which is made up of a row of slider sections. Each of the bars is lapped to form the medium facing surface. Rails are then formed in the medium facing surface. Next, the bar is divided into individual sliders.

Outputs of a front-flux-probe-type head greatly varies, depending on the front flux probe length. It is therefore very important to control the front flux probe length. The front flux probe length is controlled by an amount of lapping of the medium facing surface of the above-mentioned bar.

However, an overcoat layer made of alumina ($Al_2O_3$), for example, and having a thickness of tens of micrometers is formed on the integrated surface, after the medium facing surface of the bar is lapped, that is, after the front flux probe length is determined. It is therefore impossible to directly observe the FFP layer through the use of a scanning electron microscope, for example. A currently possible method is to cut out a part of the head by a focused ion beam and to observe its cross section through the use of a transmission electron microscope, for example. However, this method is breakdown measurement and it is impossible to apply the measurement result to processing and so on of the sample itself, which is not preferred. Furthermore, this method is not practical since it takes a long time to perform cutting of the head by a focused ion beam and observing through the use of a transmission electron microscope. It is therefore difficult to control the front flux probe length of the head having the FFP layer. Variations in outputs thereby result.

OBJECTS AND SUMMARY OF THE INVENTION

It is a first object of the invention to provide a magnetoresistive device substructure or a magnetoresistive device, or a method of manufacturing such a magnetoresistive device substructure or a magnetoresistive device. With regard to the magnetoresistive device including the magnetoresistive element and a soft magnetic layer having at least one of the function of introducing a signal field to the magnetoresistive element and the function of inducing a bias field thereto, the substructure or the device, or the method of the invention allows precise control of the arrangement of the magnetoresistive element and the soft magnetic layer with respect to each other and the dimensions of the soft magnetic layer, and reduces variations in output.

It is a second object of the invention to provide a micro device or a method of manufacturing such a micro device, the micro device including a first patterned thin film and a second patterned thin film that covers the first thin film. The micro device or the method of the invention allows precise control of the arrangement of the first and second thin films with respect to each other and the dimensions of the second thin film.

A magnetoresistive device substructure of the invention is used for manufacturing a magnetoresistive device incorporating: a magnetoresistive element; and a soft magnetic layer covering the magnetoresistive element and having at least one of functions of introducing a signal magnetic flux to the magnetoresistive element and inducing a bias magnetic field thereto. The substructure comprises: the magnetoresistive element; the soft magnetic layer; and an indicator having a shape similar to the magnetoresistive element and located in a specific position with respect to the magnetoresistive element.

A magnetoresistive device of the invention comprises: a magnetoresistive element; a soft magnetic layer covering the magnetoresistive element and having at least one of functions of introducing a signal magnetic flux to the magnetoresistive element and inducing a bias magnetic field thereto; and an indicator having a shape similar to the magnetoresistive element and located in a specific position with respect to the magnetoresistive element.

According to the magnetoresistive device substructure or the magnetoresistive device of the invention, it is possible to control the arrangement of the magnetoresistive element and the soft magnetic layer with respect to each other and to control the dimensions of the soft magnetic layer through the use of the indicator.

According to the magnetoresistive device substructure or the magnetoresistive device of the invention, the indicator may be a dummy element having a configuration similar to that of the magnetoresistive element and being incapable of functioning as a magnetoresistive element.

The magnetoresistive device substructure or the magnetoresistive device of the invention may further comprise a dummy layer located in a specific position with respect to the soft magnetic layer and located off the indicator.

The magnetoresistive device substructure or the magnetoresistive device of the invention may further comprise an overcoat layer covering the soft magnetic layer and having an opening located in a portion corresponding to the indicator.

According to the magnetoresistive device substructure of the invention, the indicator may be located in a position at which the substructure is divided to fabricate the magnetoresistive device.

A method of the invention is provided for manufacturing a magnetoresistive device substructure used for manufacturing a magnetoresistive device incorporating: a magnetoresistive element; and a soft magnetic layer covering the magnetoresistive element and having at least one of functions of introducing a signal magnetic flux to the magnetoresistive element and inducing a bias magnetic field thereto. The method comprises the steps of: forming the magnetoresistive element and an indicator having a shape similar to the magnetoresistive element and located in a specific position with respect to the magnetoresistive element; and forming the soft magnetic layer in a specific position referring to the position of the indicator.

A method of the invention is provided for manufacturing a magnetoresistive device incorporating: a magnetoresistive element; and a soft magnetic layer covering the magnetoresistive element and having at least one of functions of introducing a signal magnetic flux to the magnetoresistive element and inducing a bias magnetic field thereto. The method comprises the steps of: forming the magnetoresistive element and an indicator having a shape similar to the magnetoresistive element and located in a specific position with respect to the magnetoresistive element; and forming the soft magnetic layer in a specific position referring to the position of the indicator.

According to the method of manufacturing the magnetoresistive device substructure or the method of manufacturing the magnetoresistive device of the invention, it is possible to control the arrangement of the magnetoresistive element and the soft magnetic layer with respect to each other and to control the dimensions of the soft magnetic layer through the use of the indicator.

According to the method of manufacturing the magnetoresistive device substructure or the method of manufacturing the magnetoresistive device of the invention, the indicator may be a dummy element having a configuration similar to that of the magnetoresistive element and being incapable of functioning as a magnetoresistive element.

According to the method of manufacturing the magnetoresistive device substructure or the method of manufacturing the magnetoresistive device of the invention, in the step of forming the soft magnetic layer, a dummy layer may be formed at the same time as the soft magnetic layer, the dummy layer being located in a specific position with respect to the soft magnetic layer and located off the indicator.

The method of manufacturing the magnetoresistive device substructure or the method of manufacturing the magnetoresistive device of the invention may further comprise the step of forming an overcoat layer covering the soft magnetic layer and having an opening located in a portion corresponding to the indicator.

The method of manufacturing the magnetoresistive device substructure or the method of manufacturing the magnetoresistive device of the invention may further comprise the steps of: forming an overcoat layer covering the soft magnetic layer and the indicator; and forming an opening of the overcoat layer by selectively etching a portion of the overcoat layer that corresponds to the indicator. In this case, either of the methods may further comprise the step of forming a film for stopping reactive ion etching on the indicator prior to the step of forming the overcoat layer, wherein the opening is formed through the reactive ion etching in the step of forming the opening.

According to the method of manufacturing the magnetoresistive device substructure or the method of manufacturing the magnetoresistive device of the invention, the indicator may be located in a position at which the substructure is divided to fabricate the magnetoresistive device.

A micro device of the invention includes a first patterned thin film and a second patterned thin film covering the first thin film. The device further comprises an indicator having a shape similar to the first thin film and located in a specific position with respect to the first thin film.

A method of the invention is provided for manufacturing a micro device including a first patterned thin film and a second patterned thin film covering the first thin film. The method comprises the steps of forming the first thin film and an indicator having a shape similar to the first thin film and located in a specific position with respect to the first thin film; and forming the second thin film in a specific position referring to the position of the indicator.

According to the micro device or the method of manufacturing the same of the invention, it is possible to control the arrangement of the first and second patterned thin films with respect to each other and to control the dimensions of the second thin film through the use of the indicator. In the present patent application the micro device means a small-size device fabricated through the use of thin-film forming techniques.

Other and further objects, features and advantages of the invention will appear more fully from the following description.

BRIEF DESCRIPTION OF THE DRAWINGS

FIG. 3A and FIG. 3B illustrate a step that follows FIG. 2A and FIG. 2B.

FIG. 4A and FIG. 4B illustrate a step that follows FIG. 3A and FIG. 3B.

FIG. 5A and FIG. 5B illustrate a step that follows FIG. 4A and FIG. 4B.

FIG. 6A and FIG. 6B illustrate a step that follows FIG. 5A and FIG. 5B.

FIG. 7A and FIG. 7B illustrate a step that follows FIG. 6A and FIG. 6B.

FIG. 8A and FIG. 8B illustrate a step that follows FIG. 7A and FIG. 7B.

FIG. 9A and FIG. 9B illustrate a step that follows FIG. 8A and FIG. 8B.

FIG. 10A and FIG. 10B illustrate a step that follows FIG. 9A and FIG. 9B.

FIG. 11A and FIG. 11B illustrate a step that follows FIG. 10A and FIG. 10B.

FIG. 12A and FIG. 12B illustrate a step that follows FIG. 11A and FIG. 11B.

FIG. 13A and FIG. 13B illustrate a step that follows FIG. 12A and FIG. 12B.

FIG. 14A and FIG. 14B illustrate a step that follows FIG. 13A and FIG. 13B.

FIG. 15A and FIG. 15B illustrate a step that follows FIG. 14A and FIG. 14B.

FIG. 16 is a schematic perspective view for illustrating the step of lapping the medium facing surface of the bar of the embodiment of the invention.

DETAILED DESCRIPTION OF THE PREFERRED EMBODIMENT

A preferred embodiment of the invention will now be described in detail with reference to the accompanying drawings. The following are descriptions of a magnetoresistive device substructure and a magnetoresistive device, and methods of manufacturing the substructure and the device of the embodiment of the invention. Since the magnetoresistive device is an example of a micro device, the following descriptions also apply to a micro device and a method of manufacturing the same of the embodiment.

FIG. 1A to FIG. 15A and FIG. 1B to FIG. 15B illustrate steps of the method of manufacturing the magnetoresistive device substructure including a TMR element and a soft magnetic layer having the functions of introducing a signal flux to the TMR element and inducing a bias field thereto. FIG. 1A to FIG. 15A are cross sections thereof FIG. 1B to FIG. 15B illustrate integrated surfaces.

Figure 1A:
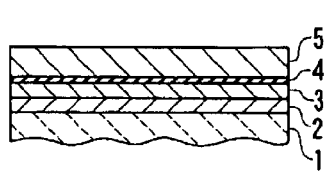
FIG. 1A and FIG. 1B illustrate a step in a method of manufacturing a magnetoresistive device substructure of an embodiment of the invention.
Figure 1B:
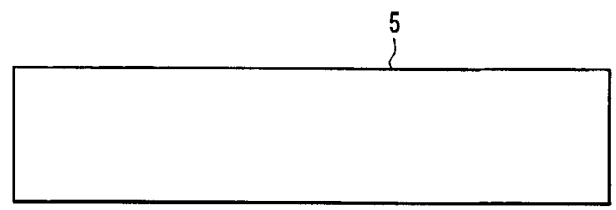

In this method, as shown in FIG. 1A and FIG. 1B, a pinning layer 2, a pinned layer 3, a tunnel barrier layer 4 and a free layer 5 are stacked on a substrate (wafer) 1 one by one.

The material of the pinning layer 2 may be any material capable of pinning the magnetization of the pinned layer 3. In general, the pinning layer 2 is made of an antiferromagnetic material such as PtMn. The material of the pinned layer 3 and the free layer 5 is preferably a material that exhibits a high degree of spin polarization, so that a high rate of change in resistance is obtained, such as Fe, Co, Ni, FeCo, NiFe, CoZrNb, or FeCoNi. Each of the pinned layer 3 and the free layer 5 may be made up of either a single layer or a plurality of layers. The tunnel barrier layer 4 is made of a material such as $Al_2O_3$, NiO, GdO, MgO, $Ta_2O_5$, $MoO_2$, $TiO_2$, or $WO_2$.

Figure 2A:
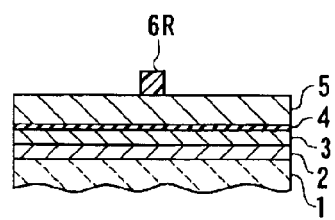
FIG. 2A and FIG. 2B illustrate a step that follows FIG. 1A and FIG. 1B.
Figure 2B:
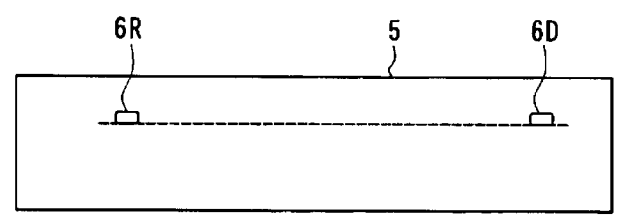

Next, as shown in FIG. 2A and FIG. 2B, a resist mask 6R used for patterning the TMR element and another resist mask 6D are formed by photolithography on the free layer 5. The resist mask 6D is used for patterning a dummy TMR element (hereinafter called the dummy element) that has a configuration similar to the actual TMR element but will not function as an actual TMR element. The broken line of FIG. 2B indicates the level at a specific distance from the medium facing surface that will be formed later. As shown in FIG. 2B, the resist masks 6R and 6D are located at the specific distance from the medium facing surface to be formed.

Next, as shown in FIG. 3A and FIG. 3B, the pinning layer 2, the pinned layer 3, the tunnel barrier layer 4 and the free layer 5 are selectively etched through ion milling, for example, using the resist masks 6R and 6D. The TMR element 20R and the dummy element 20D, each of which is made up of the pinning layer 2, the pinned layer 3, the tunnel barrier layer 4 and the free layer 5 that are patterned, are thus formed. The TMR element 20R corresponds to the first patterned thin film of the micro device of the invention. The dummy element 20D corresponds to the indicator of the invention.

Next, as shown in FIG. 4A and FIG. 4B, an insulating layer 7 is formed around the TMR element 20R and the dummy element 20D. The resist masks 6R and 6D are then removed.

Next, as shown in FIG. 5A and FIG. 5B, a bias field inducing layer 8 made of a soft magnetic material is formed on the TMR element 20R, the dummy element 20D and the insulating layer 7.

Next, as shown in FIG. 6A and FIG. 6B, resist masks 9R and 9D used for patterning the bias field inducing layer 8 are formed by photolithography on the layer 8. The broken line of FIG. 6B indicates the level at a specific distance from the medium facing surface that will be formed later. As shown in FIG. 6B, the plane geometry of each of the resist masks 9R and 9D is a rectangle extending in the direction parallel to the medium facing surface. The resist masks 9R and 9D are located at the specific distance from the medium facing surface to be formed. The resist mask 9R is located such that the center portion thereof is located above the TMR element 20R. The resist mask 9D is located in a position shifted from the portion above the dummy element 20D in the direction parallel to the medium facing surface.

The field inducing layer 8 is thin enough to allow the TMR element 20R and the dummy element 20D therebelow to be observed by a scanning electron microscope. Therefore, it is possible to observe the dummy element 20D by a scanning electron microscope since the resist mask 9D is off the location above the dummy element 20D in the state shown in FIG. 6A and FIG. 6B. As a result, according to the embodiment, it is possible to precisely align the resist mask 9D, referring to the dummy element 20D, at a specific point somewhere along the direction orthogonal to the medium facing surface. The precise alignment of the resist mask 9D with respect to the dummy element 20D allows precise alignment of the resist mask 9R with respect to the TMR element 20.

Next, as shown in FIG. 7A and FIG. 7B, the field inducing layer 8 is selectively etched through ion milling, for example, using the resist masks 9R and 9D. A bias field inducing layer 8R and a dummy bias field inducing layer 8D each of which is patterned into a rectangular shape are thereby formed. The field inducing layer 8R is located such that the center portion thereof is located above the TMR element 20. The field inducing layer 8D is located in a position shifted from the portion above the dummy element 20D in the direction parallel to the medium facing surface. The resist masks 9R and 9D are then removed. The field inducing layer 8R has the function of inducing a bias magnetic field to the TMR element 20R. The field inducing layer 8R corresponds to the second patterned thin film of the micro device of the invention. The field inducing layer 8D corresponds to the dummy layer of the invention.

Next, as shown in FIG. 8A and FIG. 8B, a front flux probe (FFP) layer 10 made of a soft magnetic material is formed on the insulating layer 7, the field inducing layers 8R and 8D and the dummy element 20D.

Next, as shown in FIG. 9A and FIG. 9B, resist masks 11R and 11D used for patterning the FFP layer 10 are formed by photolithography on the layer 10. The plane geometry of each of the resist masks 11R and 11D is a rectangle extending from the portion above each of the TMR element 20R and the dummy element 20D toward the medium facing surface. Each of the resist masks 11R and 11D has a width smaller than the width of each of the TMR element 20R and the dummy element 20D. The portions in which the FFP layer 10 and the field inducing layers 8R and 8D overlap are thin enough to allow the TMR element 20R and the dummy element 20D therebelow to be observed by a scanning electron microscope. As a result, it is possible to precisely align the resist mask 11R with respect to the TMR element 20R and align the resist mask 11D with respect to the dummy element 20D.

Next, as shown in FIG. 10A and FIG. 10B, the FFP layer 10 is selectively etched through ion milling, for example, using the resist masks 11R and 11D. A front flux probe (FFP) layer 10R and a dummy front flux probe layer 10D, each of which is patterned into a rectangular shape, are thereby formed. The resist masks 11R and 11D are then removed. The FFP layer 10R has the function of introducing a signal magnetic flux to the TMR element 20R.

The T-shaped soft magnetic layer having the functions of introducing a signal flux to the TMR element 20R and inducing a bias field thereto is thus made up of the field inducing layer 8R and the FFP layer 10R.

Next, in the actual method, bias field applying layers such as hard magnet layers are formed on top of both ends of the field inducing layer 8R. These field applying layers are omitted in the drawings for brevity.

Next, as shown in FIG. 11A and FIG. 11B, a resist mask 12 is formed by photolithography. The resist mask 12 covers the TMR element 20R, the field inducing layer 8R and the FFP layer 10R, but has an opening where the dummy element 20D, the field inducing layer 8D and the FFP layer 10D are located.

Next, as shown in FIG. 12A and FIG. 12B, a reactive ion etching (RIE) stopping film 13 is formed over the entire surface. The RIE stopping film 13 is used for stopping reactive ion etching to be performed later. The RIE stopping film 13 may be made of Rh, Ti or TiW.

Next, as shown in FIG. 13A and FIG. 13B, the resist mask 12 and the RIE stopping film 13 thereon are lifted off, so that the RIE stopping film 13 remains only in the portion where the dummy element 20D, the field inducing layer 8D and the FFP layer 10D are located.

Next, in the actual method, an induction-type electromagnetic transducer is fabricated. The electromagnetic transducer incorporates a first magnetic layer and a second magnetic layer magnetically coupled to each other and including magnetic pole portions opposed to each other and placed in regions of the magnetic layers on a side of the medium facing surface that faces toward a recording medium, each of the magnetic layers including at least one layer. The transducer further incorporates: a recording gap layer provided between the pole portions of the first and second magnetic layers; and a thin-film coil at least a part of which is placed between the first and second magnetic layers, the at least part of the coil being insulated from the first and second magnetic layers. Detailed descriptions of the manufacturing steps of this transducer and drawings thereof are omitted.

Next, as shown in FIG. 14A and FIG. 14B, an overcoat layer 14 of alumina, for example, is formed over the entire surface. A resist mask 15 having a shape similar to the mask 12 is then formed by photolithography.

Next, as shown in FIG. 15A and FIG. 15B, a portion of the overcoat layer 14 located in the region where the dummy element 20D, the field inducing layer 8D and the FFP layer 10D are located is removed by RIE. This RIE is performed to reach the RIE stopping layer 13. Furthermore, the RIE stopping layer 13 is removed by ion milling. As shown in FIG. 15B, an opening 21 of the overcoat layer 14 is thereby formed. The opening 21 is located in the region where the dummy element 20D, the field inducing layer 8D and the FFP layer 10D are located. Through the opening 21, the dummy element 20D, the field inducing layer 8D and the FFP layer 10D are exposed.

As thus described, the magnetoresistive device substructure of the embodiment is obtained. This substructure has a plurality of rows of sections to be sliders (hereinafter called slider sections). Each of the slider sections includes at least the TMR element 20R, the field inducing layer 8R and the FFP layer 10R.

The thin-film magnetic head incorporating the magnetoresistive device of the embodiment is made up of a slider having the magnetoresistive device formed on its trailing edge. The slider is formed through the following steps. The above-described substructure is cut in one direction to form blocks called bars each of which is made up of a row of slider sections. Each of the bars is lapped to form the medium facing surface. Rails are then formed in the medium facing surface. Next, the bar is divided into individual sliders. The magnetoresistive device incorporated in each of the sliders includes at least the TMR element 20R, the field inducing layer 8R and the FFP layer 10R. The magnetoresistive device may further include the dummy element 20D, the field inducing layer 8D and the FFP layer 10D.

Figure 17:
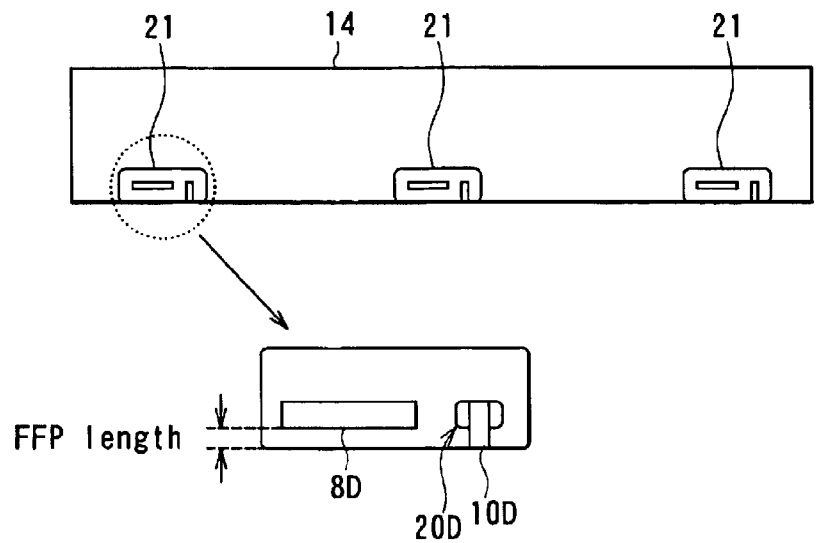
FIG. 17 illustrates the bar of FIG. 16 showing its integrated surface.

FIG. 16 is a schematic view for illustrating the step of lapping the medium facing surface of the above-mentioned bar, which shows a part of the bar. The bottom surface of the bar shown is the surface to be lapped, that is, the medium facing surface. FIG. 17 illustrates the bar of FIG. 16 showing its integrated surface. The TMR elements 20R and the dummy elements 20D are located in a row near the medium facing surface of the bar. As shown in FIG. 17, each of the openings 21 is provided in the portion in which the dummy element 20D, the field inducing layer 8D and the FFP layer 10D are located. (This portion is hereinafter called the dummy portion.) The dummy portion is thus exposed from the opening 21. As shown in FIG. 17, the distance between the medium facing surface and an end of the field inducing layer 8D that faces toward the medium facing surface is equal to distance S between the medium facing surface and an end of the field inducing layer 8R that faces toward the medium facing surface. This distance indicates the front flux probe length (FFP length of FIG. 17). According to this embodiment, it is thus possible to measure the FFP length, that is, the distance between the medium facing surface and the end of the field inducing layer 8D, by a scanning electron microscope, for example, at any time during lapping of the medium facing surface of the bar. Precise control of the FFP length is thus achieved.

According to the embodiment, it is possible to measure the distance between the medium facing surface and an end of the dummy element 20D that faces toward the medium facing surface, too, by observing the dummy portion through the opening 21. It is thereby possible to control the distance between the medium facing surface and the TMR element 20R, too.

The bar is divided into individual sliders. In this case, the dummy portions may remain in the sliders. However, if the dummy portions are located in the portions at which the bar is divided, the dummy portions are removed when the bar is divided, and no dummy portions are left in the sliders, which is preferable.

Figure 18:
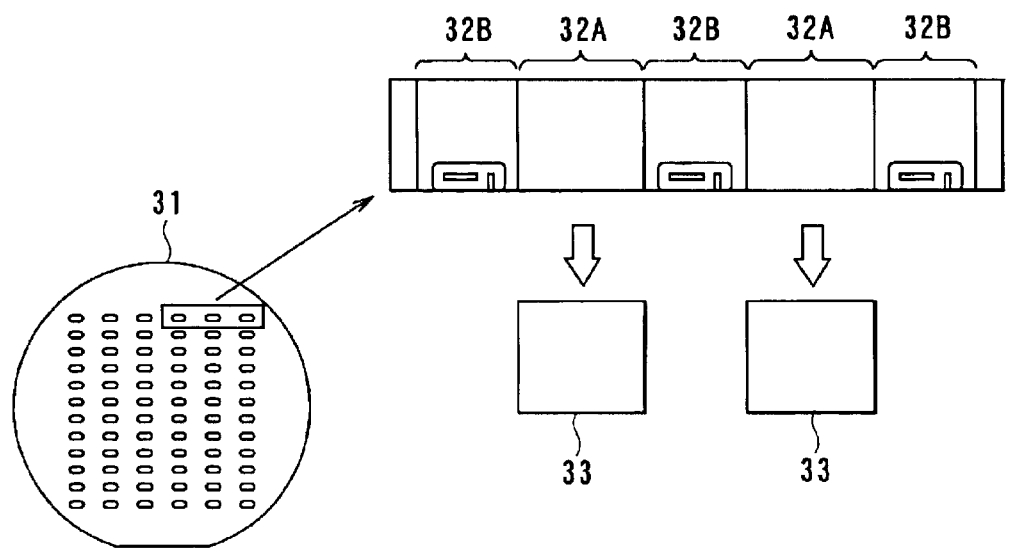
FIG. 18 illustrates an example of arrangement of the dummy portions located in the portions at which the bar is divided in the embodiment.

FIG. 18 illustrates an example of arrangement of the dummy portions located in the portions at which the bar is divided. Numeral 31 of FIG. 18 indicates a substructure made up of a plurality of rows of slider sections formed on the substrate (wafer) 1. A bar obtained from this substructure has a row of slider sections 32A and dividing portions 32B each of which is located between adjacent two of the slider sections 32A. The dividing portions 32B includes the dummy portions. Therefore, if the bar is divided at the dividing portions 32B, sliders 33 including no dummy portions or openings 21 are obtained. As a result, it is possible to avoid adverse effects that would be induced by the openings 21 and the dummy portions that may have remained, such as corrosion of the openings 21 and the dummy portions.

According to the embodiment as thus described, when the substructure including a plurality of rows of slider sections is fabricated, the dummy elements 20D are formed at the same time as the TMR elements 20R. As a result, the following effects are obtained. It is possible to precisely align the resist mask 9D with respect to the dummy element 20D. This allows the resist mask 9R to be aligned with respect to the TMR element 20 with accuracy. As a result, alignment of the field inducing layer 8R with respect to the TMR element 20 is performed with accuracy.

Another effect is that, after the steps performed on the wafer are completed, it is possible to observe the dummy field inducing layer 8D located in the same level as the field inducing layer 8R at a specific point along the direction orthogonal to the medium facing surface, when the medium facing surface of the bar is lapped. It is thereby possible to measure the front flux probe length with accuracy and to control this length.

Owing to these features of the embodiment, it is possible to reduce variations in outputs of the magnetoresistive devices resulting from variations in arrangement of the TMR element 20 and the field inducing layer 8R with respect to each other, and from variations in front flux probe length.

Figure 19:
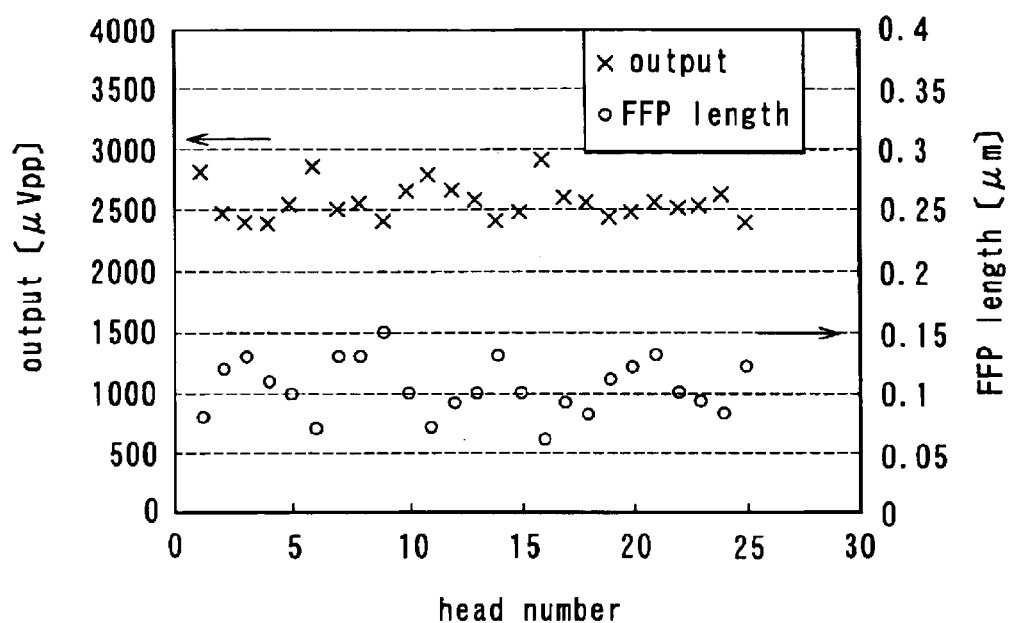
FIG. 19 is a plot of the result of measurement of front flux probe lengths and outputs of magnetoresistive devices incorporated in head samples fabricated without dummy elements.

FIG. 19 shows the result of measurement of front flux probe lengths (FFP length of FIG. 19) and outputs of magnetoresistive devices incorporated in head samples (head numbers 1 to 25) fabricated without the dummy elements 20D.

Figure 20:
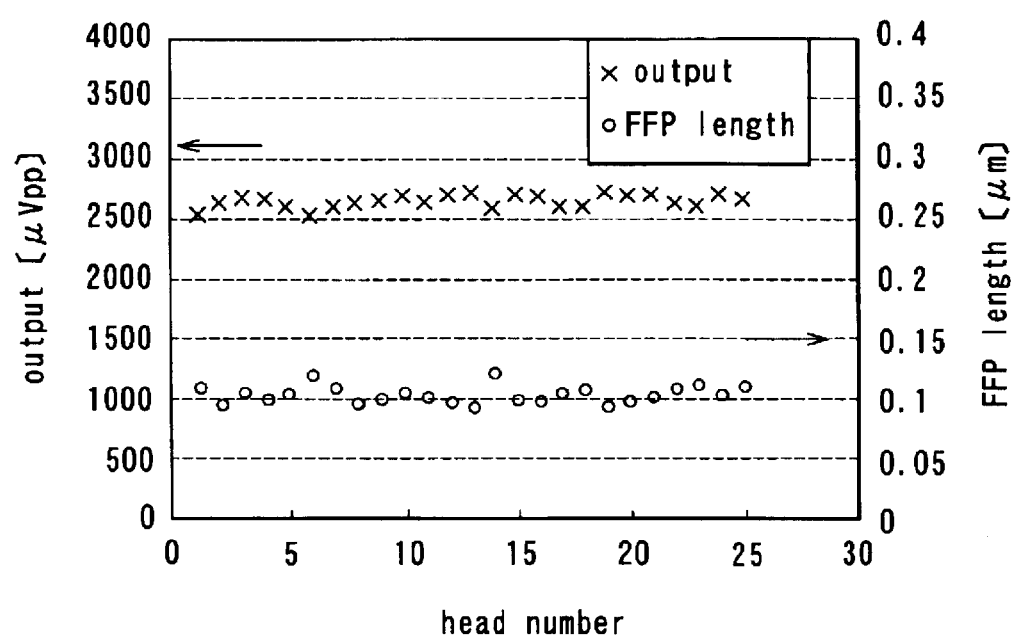
FIG. 20 is a plot of the result of measurement of front flux probe lengths and outputs of magnetoresistive devices of the embodiment of the invention incorporated in head samples.
Figure 21:
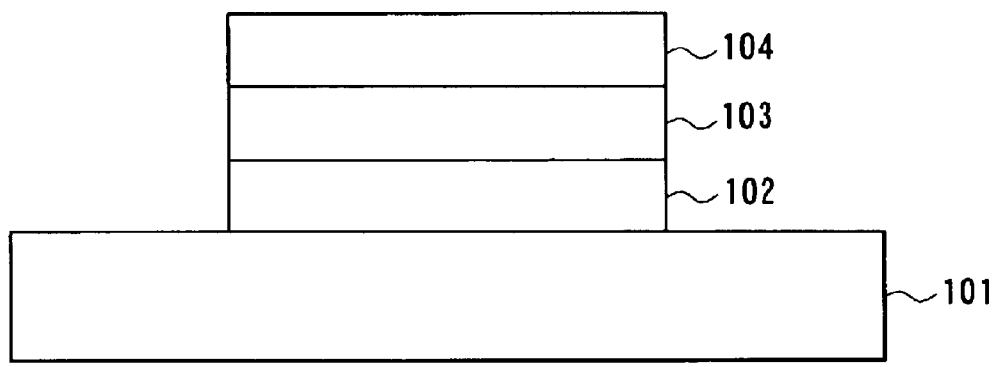
FIG. 21 illustrates the configuration of the TMR element.
Figure 22:
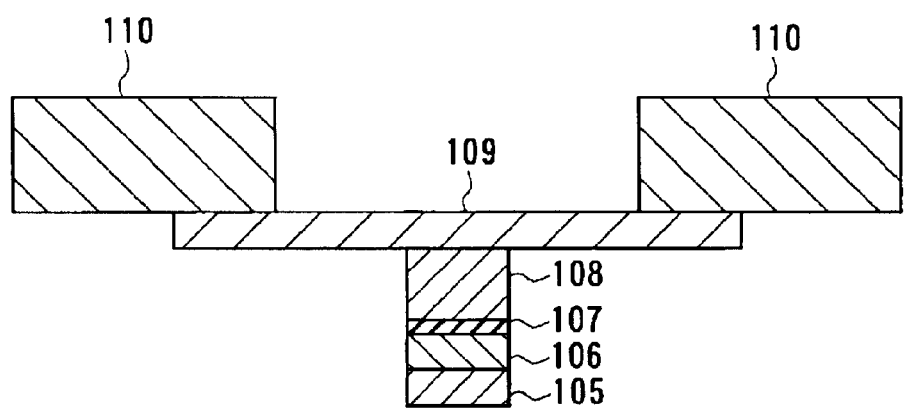
FIG. 22 is a cross section of the main part of the front-flux-probe-type head.
Figure 23:
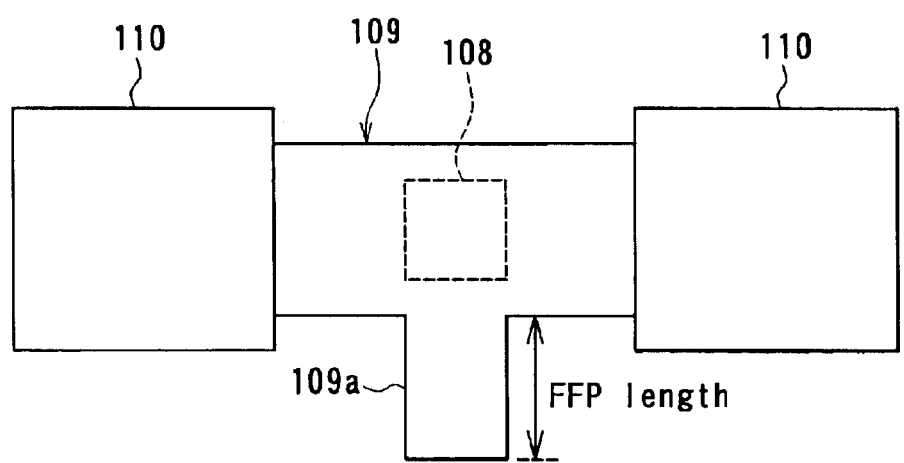
FIG. 23 is a top view of the main part of the front-flux-probe-type head.
Figure 24A:
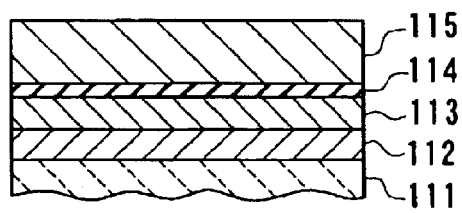
FIG. 24A and FIG. 24B illustrate a step in the method of manufacturing the magnetoresistive device including the T-shaped soft magnetic layer.
Figure 24B:
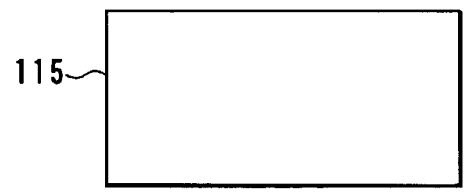
Figure 25A:
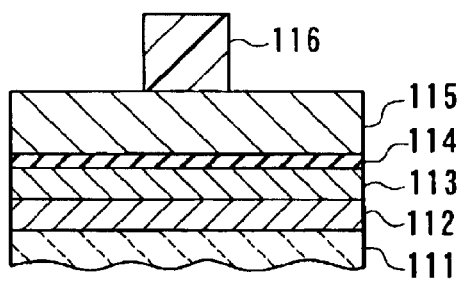
FIG. 25A and FIG. 25B illustrate a step that follows FIG. 24A and FIG. 24B.
Figure 25B:
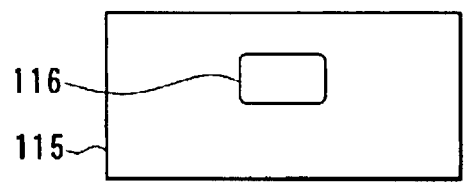
Figure 26A:
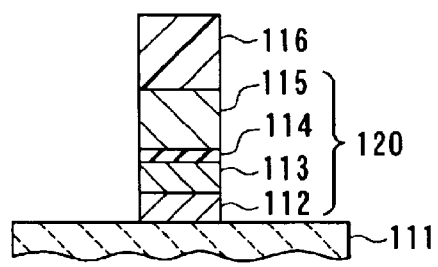
FIG. 26A and FIG. 26B illustrate a step that follows FIG. 25A and FIG. 25B.
Figure 26B:
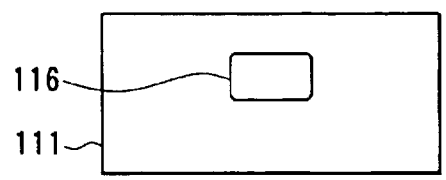
Figure 27A:
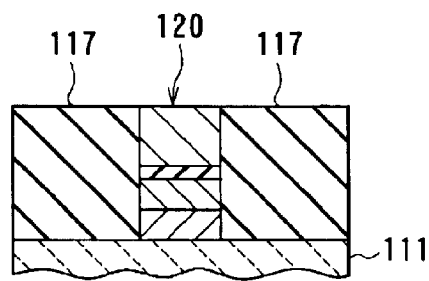
FIG. 27A and FIG. 27B illustrate a step that follows FIG. 26A and FIG. 26B.
Figure 27B:
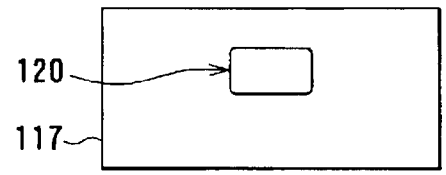
Figure 28A:
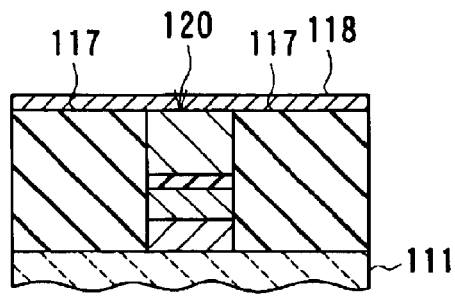
FIG. 28A and FIG. 28B illustrate a step that follows FIG. 27A and FIG. 27B.
Figure 28B:
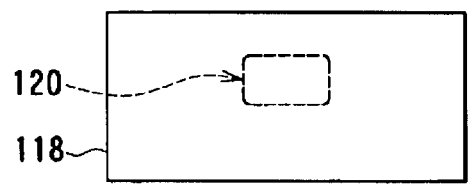
Figure 29A:
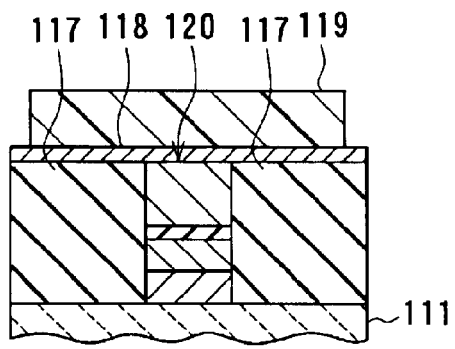
FIG. 29A and FIG. 29B illustrate a step that follows FIG. 28A and FIG. 28B.
Figure 29B:
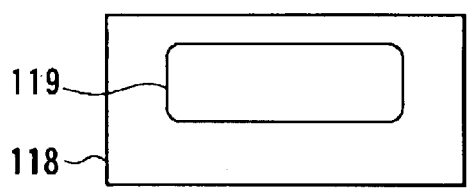
Figure 30A:
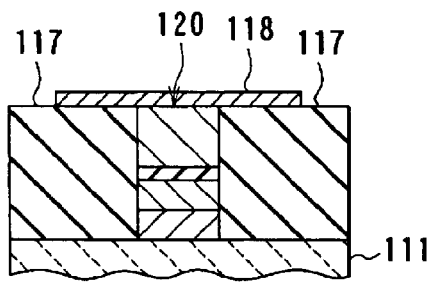
FIG. 30A and FIG. 30B illustrate a step that follows FIG. 29A and FIG. 29B.
Figure 30B:
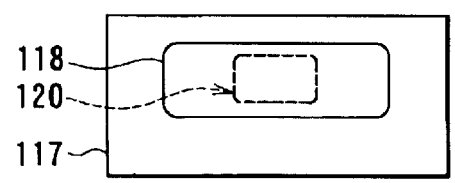
Figure 31A:
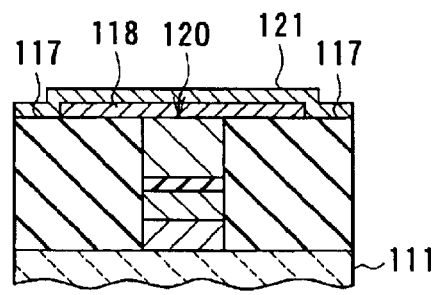
FIG. 31A and FIG. 31B illustrate a step that follows FIG. 30A and FIG. 30B.
Figure 31B:
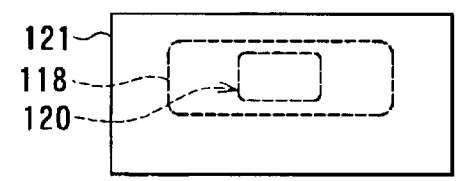
Figure 32A:
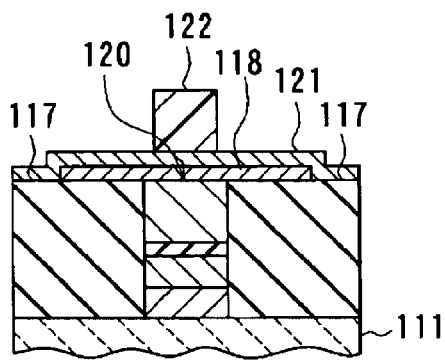
FIG. 32A and FIG. 32B illustrate a step that follows FIG. 31A and FIG. 31B.
Figure 32B:
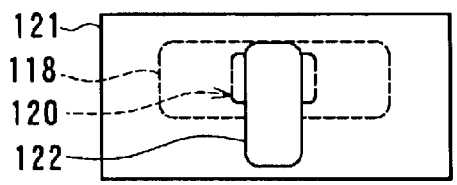
Figure 33A:
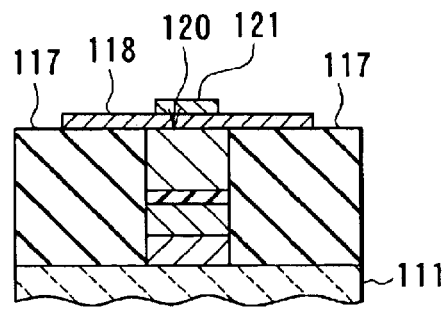
FIG. 33A and FIG. 33B illustrate a step that follows FIG. 32A and FIG. 32B.
Figure 33B:
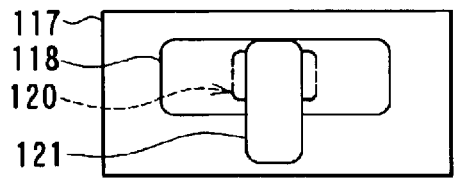

FIG. 20 shows the result of measurement of front flux probe lengths (FFP length of FIG. 20) and outputs of magnetoresistive devices of the embodiment of the invention incorporated in head samples (head numbers 1 to 25) fabricated with the dummy elements 20D.

As shown in FIG. 19 and FIG. 20, according to the embodiment of the invention, variations in front flux probe length and variations in output of the magnetoresistive devices are smaller, compared to the case in which the magnetoresistive devices are fabricated without the dummy elements 20D.

The present invention is not limited to the foregoing embodiment but may be practiced in still other ways. For example, the invention is applicable to cases in which AMR elements or GMR elements are used in place of TMR elements.

The invention is applicable to a composite thin-film magnetic head incorporating a magnetoresistive device and an induction-type electromagnetic transducer.

The invention is not limited to magnetoresistive devices but may be applied to micro devices in general that includes a first patterned thin film and a second patterned thin film covering the first pattern. In this case, it is possible to control the arrangement of the first and second thin films with respect to each other and to control the dimensions of the second thin film with accuracy.

According to the magnetoresistive device substructure or the method of manufacturing the same, or the magnetoresistive device or the method of manufacturing the same of the invention described so far, it is possible to control the arrangement of the magnetoresistive element and the soft magnetic layer with respect to each other and to control the dimensions of the soft magnetic layer through the use of the indicator. It is thereby possible to control the arrangement of the magnetoresistive element and the soft magnetic layer with respect to each other and to control the dimensions of the soft magnetic layer with accuracy and to reduce variations in output.

According to the magnetoresistive device substructure or the method of manufacturing the same, or the magnetoresistive device or the method of manufacturing the same of the invention, the indicator may be located in a position at which the substructure is divided to fabricate the magnetoresistive device. The device thereby obtained includes no indicator. It is thus possible to avoid adverse effects that would be caused by the indicator that may have remained.

According to the micro device or the method of manufacturing the same of the invention, it is possible to control the arrangement of the first and second patterned thin films with respect to each other and to control the dimensions of the second thin film through the use of the indicator. It is thereby possible to control such arrangement and dimensions with accuracy.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a magnetoresistive device substructure used for manufacturing a magnetoresistive device incorporating: a magnetoresistive element; and a patterned soft magnetic layer covering the magnetoresistive element and having at least one of functions of introducing a signal magnetic flux to the magnetoresistive element and inducing a bias magnetic field thereto, the method comprising the steps of:

forming the magnetoresistive element and an indicator having a shape similar to the magnetoresistive element and located in a specific position with respect to the magnetoresistive element;

forming an unpatterned soft magnetic layer on the magnetoresistive element;

forming a mask on the unpatterned soft magnetic layer that is used to pattern the unpatterned soft magnetic layer; and forming the patterned soft magnetic layer by selectively etching the unpatterned soft magnetic layer through the use of the mask, wherein the mask is formed by aligning with respect to the specific position of the indicator while observing the indicator, so that the mask is located above the magnetoresistive element and not above the indicator, in the step of forming the mask.

2. The method according to claim 1 wherein the indicator is a dummy element having a configuration similar to that of the magnetoresistive element and being incapable of functioning as the magnetoresistive element.

3. The method according to claim 1 wherein, in the step of forming the patterned soft magnetic layer, a dummy layer is formed at the same time as the patterned soft magnetic layer is formed, the dummy layer being located in a specific position with respect to the patterned soft magnetic layer and located off the indicator.

4. The method according to claim 1, further comprising the step of forming an overcoat layer covering the patterned soft magnetic layer and having an opening located in a portion corresponding to the indicator.

5. The method according to claim 1, further comprising the steps of:

forming an overcoat layer covering the patterned soft magnetic layer and the indicator; and forming an opening of the overcoat layer by selectively etching a portion of the overcoat layer that corresponds to the indicator.

6. The method according to claim 5, further comprising the step of forming a film for stopping reactive ion etching on the indicator prior to the step of forming the overcoat layer, wherein the opening is formed through the reactive ion etching in the step of forming the opening.

7. The method according to claim 1 wherein the indicator is located in a position at which the substructure is divided to fabricate the magnetoresistive device.

8. A method of manufacturing a magnetoresistive device incorporating: a magnetoresistive element; and a patterned soft magnetic layer covering the magnetoresistive element and having at least one of functions of introducing a signal magnetic flux to the magnetoresistive element and inducing a bias magnetic field thereto, the method comprising the steps of:

forming the magnetoresistive element and an indicator having a shape similar to the magnetoresistive element and located in a specific position with respect to the magnetoresistive element;

forming an unpatterned soft magnetic layer on the magnetoresistive element;

forming a mask on the unpatterned soft magnetic layer that is used to pattern the unpatterned soft magnetic layer; and forming the patterned soft magnetic layer by selectively etching the unpatterned soft magnetic layer through the use of the mask, wherein the mask is formed by aligning with respect to the specific position of the indicator while observing the indicator, so that the mask is located above the magnetoresistive element and not above the indicator, in the step of forming the mask.

9. The method according to claim 8 wherein the indicator is a dummy element having a configuration similar to that of the magnetoresistive element and being incapable of functioning as the magnetoresistive element.

10. The method according to claim 8 wherein, in the step of forming the patterned soft magnetic layer, a dummy layer is formed at the same time as the patterned soft magnetic layer is formed, the dummy layer being located in a specific position with respect to the patterned soft magnetic layer and located off the indicator.

11. The method according to claim 8, further comprising the step of forming an overcoat layer covering the patterned soft magnetic layer and having an opening located in a portion corresponding to the indicator.

12. The method according to claim 8, further comprising the steps of:

forming an overcoat layer covering the patterned soft magnetic layer and the indicator; and forming an opening of the overcoat layer by selectively etching a portion of the overcoat layer that corresponds to the indicator.

13. The method according to claim 12, further comprising the step of forming a film for stopping reactive ion etching on the indicator prior to the step of forming the overcoat layer, wherein the opening is formed through the reactive ion etching in the step of forming the opening.

14. The method according to claim 8 wherein the indicator is located in a position at which a magnetoresistive device substructure used for manufacturing the magnetoresistive device is divided to fabricate the magnetoresistive device.

15. A method of manufacturing a micro device including a first patterned thin film and a second patterned thin film covering the first patterned thin film, the method comprising the steps of:

forming the first patterned thin film and an indicator having a shape similar to the first patterned thin film and located in a specific position with respect to the first patterned thin film; and forming an unpatterned thin film on the first patterned thin film;

forming a mask on the unpatterned thin film that is used to pattern the unpatterned thin film; and forming the second patterned thin film by selectively etching the unpatterned thin film through the use of the mask, wherein the mask is formed by aligning with respect to the specific position of the indicator while observing the indicator, so that the mask is located above the first patterned thin film and not above the indicator, in the step of forming the mask.

* * * * *